United States Patent [19]

Satoh

[11] 4,283,684

[45] Aug. 11, 1981

[54] NON-LINEARITY COMPENSATING CIRCUIT FOR HIGH-FREQUENCY AMPLIFIERS

[75] Inventor: Gunkichi Satoh, Yokohama, Japan

[73] Assignee: Kokusai Denshin Denwa Co., Ltd., Tokyo, Japan

[21] Appl. No.: 30,361

[22] Filed: Apr. 16, 1979

[30] Foreign Application Priority Data

Apr. 17, 1978 [JP] Japan .................................. 53/44138

[51] Int. Cl.³ .......................... H03F 1/32; H03F 3/16
[52] U.S. Cl. ................................ 330/277; 330/124 R; 330/149; 330/286; 330/295
[58] Field of Search ................... 330/149, 124 R, 277, 330/286, 295; 328/163

[56] References Cited

U.S. PATENT DOCUMENTS

| | | | |
|---|---|---|---|
| 4,068,186 | 1/1978 | Sato et al. | 330/149 |
| 4,122,399 | 10/1978 | Heiter et al. | 330/149 |

FOREIGN PATENT DOCUMENTS 1414787  11/1975  United Kingdom .............. 330/149

OTHER PUBLICATIONS

"Mini FET Amps Bandaid Systems from 4–18 GHz", Microwave Systems News, vol. 7, No. 2, p. 73, Feb. 1977.

*Primary Examiner*—James B. Mullins

[57] ABSTRACT

The present invention relates to a non-linearity compensating circuit for high-frequency amplifiers comprising a branch coupler for dividing the input signal into two components, two high-frequency amplifiers, one operating in the non-linear region, the other operating in the linear region, and each receiving one of the two signal components from said branch coupler, and a signal synthesizing circuit for taking the vectorial sum of the two antiphase signals from the two amplifiers whereby the non-linearity compensating circuit provides an input/output characteristics which is just the opposite of the input/output characteristics of the high-frequency amplifier to be compensated. Basically, the non-linearity compensating circuit according to the present invention does not require long delay lines, variable attenuators or variable phase-shifters of a special design so that the whole circuit can be constructed in a microwave integrated circuit form which has a reduced power loss.

14 Claims, 9 Drawing Figures

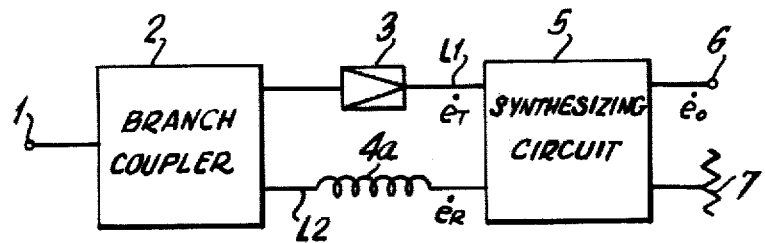
(PRIOR ART)
FIG.1
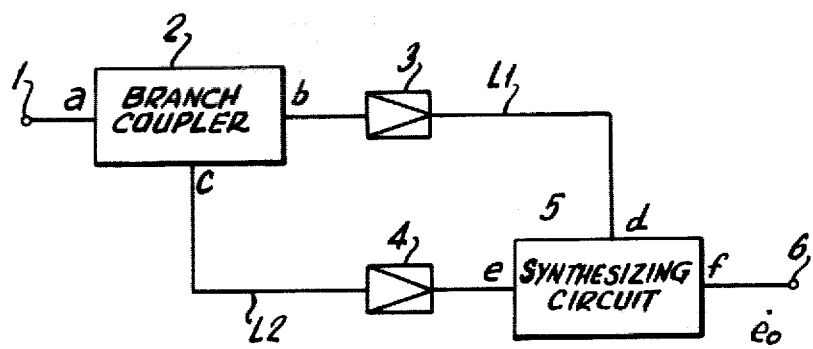
FIG.2
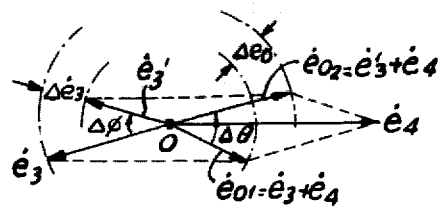
FIG.3
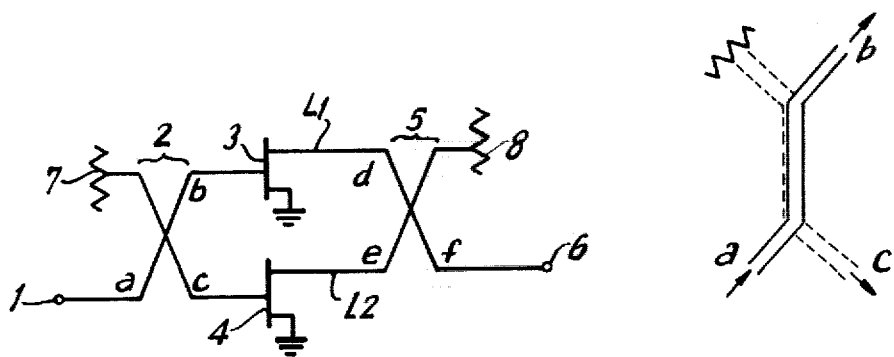 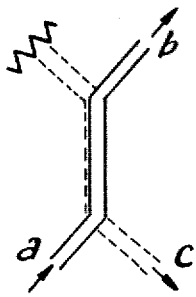
FIG.4  FIG.5

NON-LINEARITY COMPENSATING CIRCUIT FOR HIGH-FREQUENCY AMPLIFIERS

BACKGROUND OF THE INVENTION

The present invention relates to a non-linearity compensating circuit for high-frequency amplifiers, and more particularly to a non-linearity compensating circuit for high-frequency amplifiers having a non-linearity characteristics with respect to the input amplitude vs. output amplitude relationship and input amplitude vs. output phase relationship. Since the compensating circuit according to the present invention is compact and inexpensive, and has a reduced power loss so that it can be constructed in a microwave integrated circuit form, it is useful for on-board power amplifiers of the communication satellites, high-power transmitters for ground stations, and wide-band transistor amplifiers. The circuit according to the present invention allows these high-frequency amplifiers to operate efficiently in their compensated linear regions.

It is generally recognized that the negative feedback technique provides the best method for compensating a non-linearity of an amplifier and this technique has been widely used to compensate the non-linearity of ordinary amplifiers, but it is extremely difficult to apply this technique to very high-frequency amplifiers. It has been recognized that an employment of a pre-distorter is most adapted for high power and high frequency amplifiers; the pre-distorter being placed in front of the high-frequency amplifier to be compensated, has a non-linearity characteristics that is just the opposite of the non-linearity characteristics of the high-frequency amplifier to be compensated so that the overall characteristics of the combination becomes linear.

FIG. 1 shows an example of the conventional pre-distorters consisting of a branch coupler 2, a pair of channels consisting of the first channel $L_1$ and the second channel $L_2$, and a signal synthesizing circuit 5, said branch coupler 2 divides the input signal on the input terminal 1 into two components, said first channel $L_1$ includes a high-frequency amplifier for generating non-linear distortion and receives one of the two signal components from said branch coupler 2, said second channel $L_2$ includes a delay line 4a and receives the other of the two signal components from said branch coupler 2 and said synthesizing circuit 5 takes the vectorial sum of a part of the signal from the amplifier 3 and a part of the signal from the delay line 4a. A signal voltage $\dot{e}_t$, which is a part of the output signal $\dot{e}_T$ of the high frequency amplifier 3 and includes an amplitude and phase distortion having originated from the non-linearity of the amplifier 3, and a voltage signal $\dot{e}_R'$, which is a part of the output signal $\dot{e}_R$ through the delay line 4a, are summed vectorially in an antiphase relationship in the pre-distorter so that the pre-distorter provides an input/output characteristics which is just the opposite of the input/output characteristics of the high-frequency amplifier to be compensated.

In order to take the vectorial sum of the two signals in an antiphase relationship it is essential that the effective electric length of the first channel $L_1$ having a non-linear distortion generator 3 and the effective electric length of the second channel $L_2$ having a delay line 4a are approximately equal. This means that if a low power, low noise and high gain travelling wave tube (TWT) amplifier were used as the non-linear distortion generator 3 and a coaxial cable were used as the delay line 4a, the pre-distorter circuit would have a larger volume and higher power loss since the second channel length would have to be long in order to compensate the delay in the TWT amplifier which is long by nature. It might appear possible that the above-mentioned trouble would be elliminated if a high-frequency transistor amplifier were used as the distortion generating circuit 3 since a transistor amplifier has a shorter delay. But in this case, since the gain of a one-stage transistor amplifier is small, one would have to set the branching ratio of the branch coupler 2 of FIG. 1 so that the signal power applied to the high-frequency transistor amplifier is much larger than the signal power applied to the delay line 4a, or one would have to use a multi-stage transistor amplifier in order to obtain a sufficiently high gain. Thus, the employment of a one-stage transistor amplifier results in a reduction of the input signal fed to the delay line causing a larger power loss in the compensation circuit, and the employment of a multi-stage transistor amplifier has a disadvantage that a broad-band characteristics is difficult to obtain with a multi-stage transistor amplifier. Moreover, the conventional pre-distorter requires variable attenuators and variable phase-shifters for adjusting the amplitude and the phase relationship between the two output signals from the first channel $L_1$ and the second channel $L_2$ before these signals are vectorially summed at the synthesizing circuit 5 in order to obtain an output signal that cancels the distortion of the high frequency circuit to be compensated.

It is, therefore, another disadvantage of the conventional configuration that the pre-distorter circuit has a large volume and accompanies a large power loss due to the introduction of the variable attenuator and the variable phase shifter.

Thus, the pre-distorter circuit shown in FIG. 1 has several disadvantages. For one thing, the size, shape and the transmission loss of the delay line 4a present great problems when the circuit is to be constructed in a microwave integrated circuit (MIC) form. Secondly, it is very difficult to make a compact circuit having a low power-loss according to the prior technique because the variable attenuator and the variable phase-shifter have a large volume and a large power loss.

SUMMARY OF THE INVENTION

The object of the present invention is to provide a low-loss non-linearity compensating circuit for high-frequency amplifiers. Another object of the present invention is to provide a low-loss non-linearity compensating circuit for high-frequency amplifiers in a compact MIC form. Further object of the present invention is to provide a non-linearity compensating circuit for high-frequency amplifiers wherein the compensating characteristics of the non-linearity compensating circuit is controlable by electric means from outside the circuit.

The main features of the present invention consist of a preferable use of a field effect transistor chip and MIC on which are constructed a pair of parallel channels each having a high-frequency amplifier of the similar electric characteristics, a branch coupler for branching the input signal into two components and coupling them to the two inputs of the said parallel channels, and a synthesizing circuit for taking the vectorial sum of the output signals from said pair of parallel channels, wherein said high-frequency amplifier of one channel operates in the non-linear region and said high-frequency amplifier of the other channel operates in the linear region so that the transmission characteristics of the circuit corresponds approximately to the opposite characteristics of the high-frequency amplifier to be connected after the circuit and compensated.

As is seen from the above description, the circuit according to the present invention includes a high frequency amplifier in each channel, and this allows a smaller power loss due to the fact that a larger non-distorted signal is applied to the synthesizing circuit. The present invention further provides compact pre-distorter which is adapted for MIC configuration because it employs a branch coupler, a synthesizing circuit and high-frequency amplifiers instead of long delay lines, bulky variable attenuators, or variable phase-shifters, allowing a circuit size which is as small as a microwave transistor amplifier. Furthermore, the compensation characteristics of the pre-distorter can be controled by varying the gain of the two high-frequency amplifiers by means of varying the DC operating voltage of the amplifiers from the externals.

BRIEF DESCRIPTION OF THE DRAWINGS

FIG. 1 is a block diagram for explaining an example of the conventional circuits, FIG. 2 is a block diagram showing the basic configuration of a circuit according to the present invention, FIG. 3 is a vector diagram for explaining the principle of operation of the present invention, FIG. 4 is a circuit diagram showing one of the embodiments of the present invention, FIG. 5 is a diagram showing an example of a branch means or synthesizing means to be used in the present invention.

DETAILED DESCRIPTION OF PREFERRED EMBODIMENTS

Figure 6:
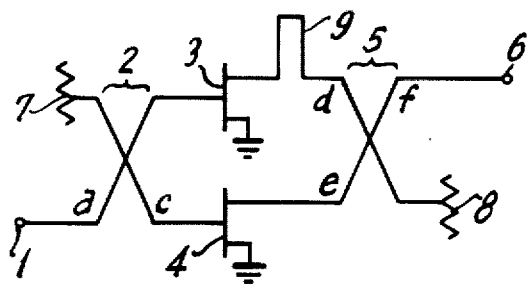
FIGS. 6, 7, 8, and 9 show circuits of the other embodiments of the present invention.

The preferred embodiments of the present invention will be described in detail in the following, referring to the accompanying drawings.

FIG. 2 shows the basic configuration of the non-linearity compensating circuit according to the present invention comprising a pair of parallel channels consisting of the first channel $L_1$ having a high-frequency amplifier 3 to be used for distorting the signal and the second channel $L_2$ having the main high-frequency amplifier 4 operating in the linear region, a branch coupler 2 for branching the input signal on the input terminal 1 into two components and applying most of the signal to distorting amplifier 3 and the rest of the signal to the main amplifier 4, and a synthesizing circuit 5 for synthesizing the output signals of the distorting amplifier 3 and the main amplifier 4. The two high-frequency amplifiers 3 and 4 have similar input/output characteristics such as amplitude, phase, gain, frequency or delay characteristics and may be constructed using transistors of the same specification. The circuit according to the present invention employs two high-frequency amplifiers 3 and 4 of the similar input/output characteristics which operate at different signal levels determined by setting the branching ratio of the branch coupler. The high-frequency amplifier 3 operates in non-linear region for distorting the signal and the other high-frequency amplifier 4 operates within the linear region to function as the main amplifier, and the input/output characteristics opposite to those of ordinary amplifiers are obtained by taking vectorial sum of these two amplifier outputs in an antiphase relationship to generate the output signal $e_0$. In this way, the transmission characteristics of this pre-distorter circuit are such that the relative increment of the output signal is larger than the relative increment of the input signal and the phase of the output signal leads the phase of the input signal so that the non-linear distortions of the high-frequency amplifier which follows this circuit are compensated and the overall transmission characteristics is linearized. Branch coupler 2 and the synthesizing circuit 5 consist of directional couplers which employ a strip line, a coaxial cable or a waveguide.

Referring now to FIG. 2, most part of the signal applied to the input terminal 1 is applied to the distorting amplifier 3 and the remaining part of the signal is applied to the main amplifier 4 since the transmission coefficients Tab and Tac of the branch circuit 2 hold the relationship Tab > Tac and the transmission coefficients Tdf and Tef of the synthesizing circuit 5 hold the relationship Tdf < Tef. Thus, the main amplifier 4 can continue a linear operation after the distorting amplifier 3 has gone to the non-linear operating region because the input/output characteristics of the two high-frequency amplifiers 3 and 4 are approximately the same. The outputs of the two high-frequency amplifiers 3 and 4 are then synthesized at a synthesizing circuit 5 where Tdf < Tef. If the effective electric length of the first channel $L_1$ and the second channel $L_2$ are different by about $\pi$ radians, and the transmission coefficients of the branch coupler 2 and the synthesizing circuit 5 hold the relationship Tef > Tab > Tac > Tdf, the circuit aquires an overall input/output characteristics which is approximately the opposite of the input/output characteristics of the distorter amplifier 3, and by adjusting the branching ratio, summing ratio and the difference of the effective electric lengths, the characteristics of the whole circuit can be adjusted to be able to compensate high-frequency amplifiers of an arbitrary characteristics.

An example of signal synthesis is shown in FIG. 3, herein signal voltage $\dot{e}_3$ and $\dot{e}_4$ are normalized by the input signal voltage at the input terminal 1. Signal voltage $\dot{e}_3$ through the first channel $L_1$ and the signal voltage $\dot{e}_4$ through the second channel $L_2$ are summed vectorially to generate an output voltage $\dot{e}_3 + \dot{e}_4 = \dot{e}_{01}$ when the two high-frequency amplifiers 3 and 4 are operating in the linear region. On the other hand, when the distorting amplifier 3 is operating at the non-linear level and the main amplifier 4 is operating at the linear level, the signal voltage component $\dot{e}_3$ at the output terminal 6 changes by $-\Delta \dot{e}_3$ in amplitude and by $-\Delta \phi$ in phase to produce the sum $\dot{e}'_3$.

The output voltage is represented by $\dot{e}'_3 + \dot{e}_4 = \dot{e}_{02}$, since the signal voltage component $\dot{e}_4$ remains constant, and it is different by $\Delta e_0$ in amplitude and by $\Delta \theta$ in phase from the output signal $\dot{e}_{01}$ which would be obtained if the both amplifiers were operating in their linear regions so that one can vary the non-linearity of the circuit by adjusting the non-linear characteristics of the distorting amplifier 3 and the amplitude ratio and the phase relationship between the signal components from channel $L_1$ and channel $L_2$ at the terminal 6. The amplitude ratio and the phase relationship are adjusted ordinarily in the ranges $$|\dot{e}_4|/|\dot{e}_4| - |\dot{e}_3| = 5 \sim 15 \, dB$$

and $0.9\pi - 1.1\pi$ radians respectively, in order to obtain the required non-linearity. The adjustment ranges may vary according to the non-linear characteristics of the distorting amplifier 3 and the high-frequency amplifiers to be compensated.

As has been described in reference to FIG. 2, the pre-distorter circuit according to the present invention has the following advantages due to the fact that the high-frequency amplifiers 3 and 4 in channels $L_1$ and $L_2$ respectively have approximately equal characteristics and the circuits of the channels $L_1$ and $L_2$ are arranged symmetrically:

(1) A special delay line such as a long coaxial cable is not necessary because the effective electric lengths of the channels $L_1$ and $L_2$ are, by nature, approximately equal.

(2) There is no difficulty in matching the impedance of the amplifiers, because the distorting amplifier 3 and the main amplifier 4 are connected on both input and output sides to a branch coupler 23 and a synthesizing circuit 5, and there is no interference between the two high-frequency amplifiers 3 and 4. It follows that the gain of the amplifiers can be varied by varying the DC operating voltage without affecting other characteristics such as amplitude-frequency characteristics. No special variable attenuator is necessary for adjusting the amplitude ratio of the signals to be synthesized.

(3) The circuit has a reduced power loss, and the non-linearity characteristics is variable to some extent while the loss in the circuit remains constant due to the amplifier 4 introduced in the second channel $L_2$.

(4) The circuit does not require any special delay lines or special variable attenuator and it is adapted for a compact MIC configuration.

The non-linearity compensating circuit for high-frequency amplifiers according to the present invention will now be described in more detail in the followings with respect to the embodiments shown in FIGS. 4 to 9.

The circuit shown in FIG. 4 includes a branch coupler 2 and a synthesizing circuit 5 which are made of a parallel line-couple-type directional coupler adapted for MIC, and high-frequency amplifiers 3 and 4 which are made of broad-band field effect transistor chip of a MIC configuration more adapted for high-frequency application than bipolar transistors. These branch coupler 2, synthesizing circuit 5, and high-frequency amplifiers 3 and 4 are all formed on a MIC chip by means of the thin film technology. The reference numbers 7 and 8 indicate terminal resistances. Either the branch coupler 2 or synthesizing circuit 5 is made of an ordinary parallel line-couple-type directional coupler shown in FIG. 5 in which Tab is greater than Tac, and the other is made of a coupler in which Tab is less than Tac. The effective electric length between a and b is longer than the electric length between a and c by $\pi/2$ radians in both cases. Referring now to the circuit shown in FIG. 4, it is assumed here that the transmission coefficients of the branch coupler hold the relationship Tab > Tac, and the transmission coefficients of the synthesizing circuit 5 hold the relationship Tef > Tdf. If the relationship were contrary to the above assumptions, a proper circuit would be obtained by reversing the roles of the input terminal 1 and the terminal resistor 7 or the output terminal 6 and the terminal resistor 8. The connections between the branch coupler 2 and the synthesizing circuit 5 being symmetric in the circuit of FIG. 4, the electric length of the path a-b-d-f along the first channel $L_1$ is longer than the electric length of the path a-c-e-f along the second channel $L_2$ by $\pi$ radians, hence the antiphase relationship is obtained simply by the branch coupler 2 and the synthesizing circuit 5. It follows that the pre-distorter shown in FIG. 4 includes no other elements than the directional couplers 2 and 5 and the high-frequency amplifiers 3 and 4, and the band-width of the whole circuit is determined solely by the band-width of the directional couplers 2 and 5 and the high-frequency amplifiers 3 and 4, hence this configuration provides a broad-band compensation circuit. In order to adjust the input/output characteristics of the circuit of FIG. 4 to the desired non-linearity, the amplitude ratio of the signals to be synthesized is determined by setting the transmission coefficient Tac at the branch coupler 2, the transmission coefficient Tdf at the synthesizing circuit 5 and the ratio of these two coefficients Tac/Tdf which is larger than a unit: then the amplitude ratio and the phase relationship of the signals are fine-adjusted according to the following procedures. The amplitude ratio is fine-adjusted by varying the DC operating voltage of the high-frequency amplifiers 3 and 4. The phase difference of the first and the second channels $L_1$ and $L_2$ is fine-adjusted by inserting an adjustment member made of a metalic or dielectric bar to the place where a part of the dielectric MIC base is taken off.

FIG. 6 shows a circuit in which the branch coupler 2 and the synthesizing circuit 5 are ordinary directional coupler where the transmission coefficient Tab is greater than Tac in FIG. 5. Since the connection of the branch coupler 2 and the synthesizing circuit 5 is anti-symmetric in this configuration, the effective electric lengths of both channels cancel each other so that no difference in the electric length is obtained. Therefore, an MIC line 9 having a half the wave length ($\pi/2$) has been added as a phase inverter circuit. The path a-b-d-f along the first channel $L_1$ is longer than the path a-c-e-f along the second channel $L_2$ by about $\pi$ radians due to the introduction of the MIC line 9, hence the phase-relationship between these two channels depends upon the frequency-phase characteristics of the MIC line 9. This means that the overall band-width of this circuit depends upon the band-width with respect to the phase-frequency characteristics of the MIC line 9 added as a phase inverter circuit, if the band-widths of the high-frequency amplifiers 3 and 4 and the directional couplers 2 and 5 are sufficiently broad. The introduction of the MIC line 9 does not prevent the circuit from having a compact size and a reduced loss, because the line 9 is very short with a length of $\pi/2$. The MIC line 9 may also be introduced in the second channel $L_2$.

Figure 7:
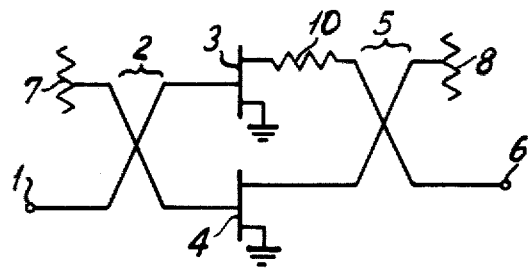

The circuit shown in FIG. 7 employs a directional-coupler type 3 dB hybrid circuit as the synthesizing circuit 5 and a fixed attenuator chip 10 is inserted on the output side of the distorting amplifier 3. The power loss of this circuit is higher by about 3 dB than the power loss of the previous circuit because the degree of coupling of the synthesizing circuit 5 is $-3$ dB.

There is, however, an advantage in this configuration: a 3 dB hybrid circuit 5 is easily constructed on a MIC chip; the circuit has a broad band-width because the overall band-width is determined solely by the band-width of the directional coupler 2 and 5 and the high-frequency amplifiers 3 and 4.

Figure 8:
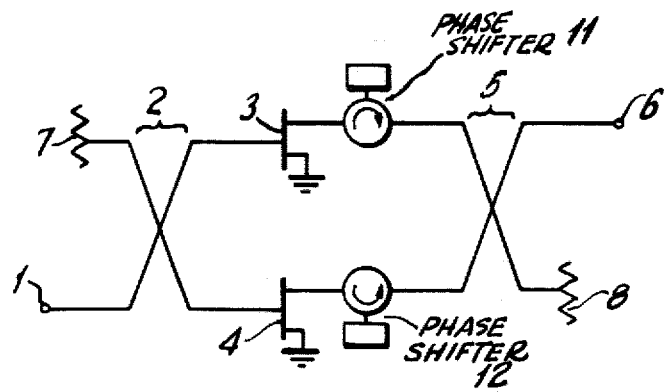

As in the case of the embodiment shown in FIG. 6, the circuit shown in FIG. 8 employs, as the branch coupler 2 and the synthesizing circuit 5, an ordinary directional coupler shown in FIG. 5 in which the transmission coefficient Tab is greater than Tac. The circuit also employs a reflection-type phase shifter 11 and 12 making use of a circulator. These phase shifters are inserted in either or both of the first and the second channels to form a phase inverter circuit. The effective electric length difference of the first and the second channels are easily adjustable by the reflection-type phase-shifters 11 and 12. The circuit may have one phase-shifter, but it may also have two or three-phase-shifters as is shown in FIG. 8.

Figure 9:
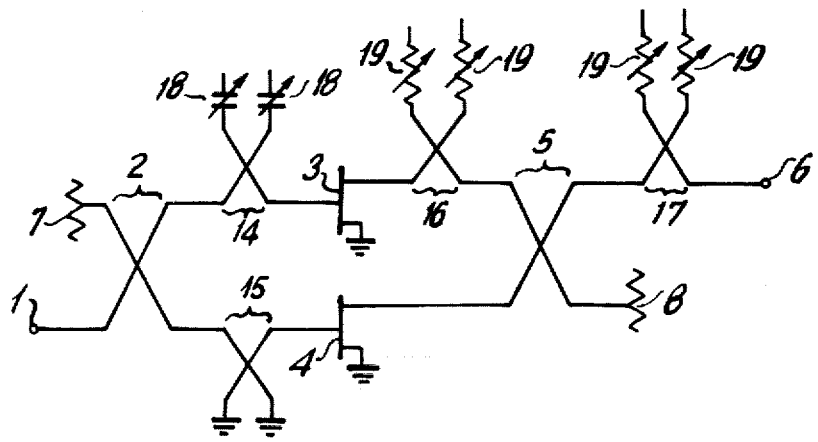

As in the case of the embodiment shown in FIG. 6, the circuit shown in FIG. 9 employs, as the branch coupler 2 and the synthesizing circuit 5, and ordinary directional coupler shown in FIG. 5 in which the transmission coefficient Tab is greater than Tac, and the circuit also employs a phase inverter circuit consisting of two directional-coupler type 3 dB hybrid circuits 14 and 15 in order to obtain an electric length difference of about $\pi$ radians; it further employs directional-coupler type 3 dB hybrid circuits 16 and 17 for adjusting the amplitude ratio of the two signal components to be synthesized and matching the signal level with the high-frequency amplifier to be compensated. The 3 dB hybrid circuit 14 is terminated by a variable capacitance diode, varactor 18 and inserted on the input side of the distorting amplifier 3. The 3 dB hybrid circuit 15 is short-circuited at its terminating ends and inserted on the input side of the main amplifier 4, and the 3 dB hybrid circuit 14 is open circuited at its terminating ends by the varactors 18, whereby, the conditions of reflection of the two 3 dB hybrid circuits 14 and 15 are approximately opposite to each other, resulting in an electric length difference of about $\pi$ radians. The difference in the electric length i.e. the phase difference is fine-adjusted by varying the DC voltage applied to the varactor 18. The 3 dB hybrid circuit 16 is terminated by PIN diodes 19 and inserted on the output side of the distorting amplifier 3, and the other 3 dB hybrid circuit 17 is also terminated by PIN diodes 19 and inserted in the output side of the synthesizing circuit 5, hence the only phase shift which takes place in the circuit is due to the difference in line length, so that the whole configuration functions as an variable attenuator, as the DC voltage applied to the PIN diode 19 varies, resulting in a change in the terminal resistance of the 3 dB hybrid circuits 16 and 17. In this way, the amplitude ratio of the signals to be synthesized and the level-matching with the high-frequency amplifier to be compensated are adjustable without changing the gain of the amplifiers 3 and 4. Although FIG. 9 shows a variable phase-shifter type phase inverter with the varactors 18, it can be converted to a fixed phase-shift type by removing the varactors 18, then the electric length difference is fixed to about $\pi$ radians. Either way, the circuit shown in FIG. 9 has a broad band-width and it is adapted for MIC form, since it consists of directional couplers 2, 5, 14, 15, 16, and 17, high-frequency amplifiers 3 and 4, varactors 18 and PIN diodes 19.

In the non-linearity compensating circuit for high-frequency amplifiers according to the present invention, most reflection is absorbed by the matched loads 7 and 8 and the external circuits even when the input/output impedance of the high-frequency amplifiers 3 and 4 do not match with the line impedance which is usually 50 ohms at a microwave frequency band, only if the impedance of the external circuits connected to the input and output terminals match with the impedance of the branch coupler 2 and the synthesizing circuit 5 respectively. For this reason, the direct interference between amplifiers 3 and 4 is very small in the circuit according to the present invention and a very broad band-width is obtained. The fact that the impedance matching is not always required in the present invention makes it possible to use the field effect transistors, adapted for high-frequency applications, in spite of its high input/output impedance.

As has been described with respect to several embodiments, the non-linearity compensating circuit according to the present invention is very simple in structure and it includes as the fundamental elements two high-frequency amplifiers of the similar characteristics, a branch coupler, and a synthesizing circuit. Thus, the present invention can provide an economical and compact pre-distorter, by means of chip transistors and the thin film technology, which is as compact as conventional balanced transistor amplifiers and especially adapted for use as a pre-distorter for on-board power amplifiers of communication satellites. Although configurations in which coaxial cable circuits and waveguide circuits are employed have not been described here, it can be easily seen that the compensating circuit according to the present invention can be constructed by using such circuit configurations to achieve a low power loss, compact size and low cost, since, also in this case, long delay lines or special variable attenuators are not required. Thus the present invention provides compact and inexpensive compensation circuits with a low power-loss which can linearize the high-frequency amplifiers to be compensated up to a signal level near saturation point of the amplifiers. The present invention is useful to obtain an efficient microwave high-power transmitter and an efficient broad-band transistor amplifier for the purpose of on-board power amplifiers of communication satellites or high-power transmitters of the ground stations.

I claim:

1. A non-linearity compensating circuit for high-frequency amplifiers, comprising a pair of parallel channels each having a high-frequency amplifier of similar characteristics, branching means for branching the input signal so that the input signal is coupled to the two inputs of said pair of parallel channels, and synthesizing means for taking a vectorial sum of the two output signals from said channels, said high-frequency amplifier included in one of said channels being operable up to the non-linear region of the input/output characteristics, and said high-frequency amplifier included in the other of said channels being operable within the linear region of the input/output characteristics, said branching means and said synthesizing means being parallel-line-couple-type directional couplers, the effective electric length between the input and output of one of the said pair of channels being longer by about $\pi$ radians than the effective electric length between the input and output of the other channel by selecting the transmission coefficients of said parallel-line-couple-type directional couplers, whereby the non-linear input/output characteristics of the whole circuit is approximately the opposite of the input/output characteristics of the high-frequency amplifier to be compensated which is serially connected to the non-linearity compensating circuit.

2. A non-linearity compensating circuit for high-frequency amplifiers, comprising a pair of parallel channels each having a high-frequency amplifier of similar characteristics, branching means for branching the input signal so that the input signal is coupled to the two inputs of said pair of parallel channels, and synthesizing means for taking a vectorial sum of the two output signals from said channels, said high-frequency amplifier included in one of said channels being operable up to the non-linear region of the input/output characteristics, and said high-frequency amplifier included in the other of said channels being operable within the linear region of the input/output characteristics, said high-frequency amplifiers being made of field effect transistors by means of microwave integrated circuit technology, said branching means and said synthesizing means being parallel-line-couple-type directional couplers, the effective electric length between the input and the output of one of said pair of channels being longer by about $\pi$ radians than the effective electric length between the input and output of the other channel by selecting the transmission coefficients of said parallel-line-couple-type directional couplers, whereby the non-linear input/output characteristics of the whole circuit is approximately the opposite of the input/output characteristics of the high-frequency amplifier to be compensated which is serially connected to the non-linearity compensating circuit.

3. A non-linearity compensating circuit for high-frequency amplifiers, comprising a pair of parallel channels each having a high-frequency amplifier of similar characteristics, branching means for branching the input signal so that the input signal is coupled to the two inputs of said pair of parallel channels, and synthesizing means for taking a vectorial sum of the two output signals from said channels, said high-frequency amplifier included in one of the said channels being operable up to the non-linear region of the input/output characteristics, and said high-frequency amplifier included in the other of said channels being operable within the linear region of the input/output characteristics, said branching means and said synthesizing means being parallel-line-couple-type directional couplers, and a phase-inverter circuit being added to said pair of parallel channels in order that the effective electric length between input and output of one of the pair of channels differs by about $\pi$ radians from the effective electric length between input and output of the other of the pair of channels, whereby the non-linear input/output characteristics of the whole circuit is approximately the opposite of the input/output characteristics of the high-frequency amplifier to be compensated which is serially connected to the non-linearity compensating circuit.

4. A non-linearity compensating circuit as claimed in claim 3, wherein said phase-inverter circuit consists of an open-ended 3 dB hybrid circuit which is inserted in one of said pair of parallel channels and a short-ended 3 dB hybrid circuit which is inserted in the other of said pair of parallel channels.

5. A non-linearity compensating circuit as claimed in claim 4, wherein each open-end of said open-ended 3 dB hybrid circuit is terminated by a varactor, a 3 dB hybrid circuit terminated by PIN diodes is inserted on the output side of said high-frequency amplifier which operates in the non-linear region, a 3 dB hybrid circuit terminated by PIN diodes is inserted on the output side of said synthesizing circuit and the whole circuit is constructed in a MIC form.

6. A non-linearity compensating circuit for high-frequency amplifiers, comprising a pair of parallel channels each having a high-frequency amplifier of similar characteristics, branching means for branching the input signal so that the input signal is coupled to the two inputs of said pair of parallel channels, and synthesizing means for taking a vectorial sum of the two output signals from said channels, said high-frequency amplifier included in one of said channels being operable up to the non-linear region of the input/output characteristics and said high-frequency amplifier included in the other of said channels being operable within the linear region of the input/output characteristics, said high-frequency amplifiers being made of field effect transistors by means of microwave integrated circuit technology, said branching means and said synthesizing means being parallel-line-couple-type directional couplers, and a phase-inverter circuit being added to said pair of parallel channels in order that the effective electric length between input and output of one of the pair of channels differs by about $\pi$ radians from the effective electric length between input and output of the other of the pair of channels, whereby the non-linear input/output characteristics of the whole circuit is approximately the opposite of the input/output characteristics of the high-frequency amplifier to be compensated which is serially connected to the non-linearity compensating circuit.

7. A non-linearity compensating circuit as claimed in claim 6, wherein said phase-inverter circuit consists of an open-ended 3 dB hybrid circuit which is inserted in one of said pair of parallel channels and a short-ended 3 dB hybrid circuit which is inserted in the other of said pair of parallel channels.

8. A non-linearity compensating circuit as claimed in claim 7, wherein each open-end of said open-ended 3 dB hybrid circuit is terminated by a varactor, a 3 dB hybrid circuit terminated by PIN diodes is inserted on the output side of said high-frequency amplifier which operates in the non-linear region, a 3 dB hybrid circuit terminated by PIN diodes is inserted on the output side of the synthesizing circuit and the whole circuit is constructed in a MIC form.

9. A non-linearity compensating circuit for high-frequency amplifiers, comprising a pair of parallel channels each having a high-frequency amplifier of similar characteristics, branching means for branching the input signal so that the input signal is coupled to the two inputs of said pair of parallel channels, and synthesizing means for taking a vectorial sum of the two output signals from said channels, said high-frequency amplifier included in one of said channels being operable up to the non-linear region of the input/output characteristics, and said high-frequency amplifier included in the other of said channels being operable within the linear region of the input/output characteristics, said branching means being a parallel-line-couple-type directional coupler, said synthesizing means being a 3 dB hybrid circuit, and a fixed attenuator chip inserted on the output side of said high-frequency amplifier operable in the non-linear region, whereby the non-linear input/output characteristics of the whole circuit is approximately the opposite of the input/output characteristics of the high-frequency amplifier to be compensated which is serially connected to the non-linearity compensating circuit.

10. A non-linearity compensating circuit for high-frequency amplifiers, comprising a pair of parallel channels each having a high-frequency amplifier of similar characteristics, branching means for branching the input signal so that the input signal is coupled to the two inputs of said pair of parallel channels, and synthesizing means for taking a vectorial sum of the two output signals from said channels, said high-frequency amplifier included in one of said channels being operable up to the non-linear region of the input/output characteristics, and said high-frequency amplifier included in the other of said channels being operable within the linear region of the input/output characteristics, said high-frequency amplifiers being made of field effect transistor by means of microwave integrated circuit technology, said branching means being a parallel-line-couple-type directional coupler, said synthesizing means being a 3 dB hybrid circuit, and a fixed attenuator chip inserted on the output side of said high-frequency amplifier which is operable in the non-linear region, whereby the non-linear input/output characteristics of the whole circuit is approximately the opposite of the input/output characteristics of the high-frequency amplifier to be compensated which is serially connected to the non-linearity compensating circuit.

11. A non-linearity compensating circuit for high-frequency amplifiers, comprising a pair of parallel channels each having a high-frequency amplifier of similar characteristics, branching means for branching an input signal to said circuit so that the input signal is coupled to the two inputs of said pair of parallel channels, synthesizing means for taking a vectorial sum of the two output signals from said channels, wherein said branching means and said synthesizing means being parallel-line-couple-type directional couplers, a phase-inverter circuit added to said pair of parallel channels in order that the effective electric length between input and output of one of the pair of channels differs by about $\pi$ radians from the effective electric length between input and output of the other of the pair of channels, said phase-inverter circuit being a line of a half wavelength which is formed in a microwave integrated circuit, said high-frequency amplifier included in one of said channels being operable up to the non-linear region of the input/output characteristics, and said high-frequency amplifier included in the other of said channels being operable within the linear region of the input/output characteristics, the operating voltage of said each high-frequency amplifier being variable, whereby the non-linear input/output characteristics of the whole circuit is approximately the opposite of the input/output characteristics of the high-frequency amplifier to be compensated which is serially connected to the non-linearity compensating circuit.

12. A non-linearity compensating circuit for high-frequency amplifiers, comprising a pair of parallel channels each having a high-frequency amplifier of similar characteristics, branching means for branching an input signal to said circuit so that the input signal is coupled to the two inputs of said pair of parallel channels, synthesizing means for taking a vectorial sum of the two output signals from said channels, said high-frequency amplifiers being made of field effect transistors by means of microwave integrated circuit technology, said branching means and said synthesizing means being parallel-line-couple-type directional couplers, a phase-inverter circuit being added to said pair of parallel channels in order that the effective electric length between input and output of one of the pair of channels differs by about $\pi$ radians from the effective electric length between input and output of the other of the pair of channels, said phase-inverter circuit being a line of a half wave length which is formed in a microwave integrated circuit, said high-frequency amplifier included in one of said channels being operable up to the non-linear region of the input/output characteristics, and said high-frequency amplifier included in the other of said channels being operable within the linear region of the input/output characteristics, the operating voltage of said each high-frequency amplifier being variable, whereby the non-linear input/output characteristics of the whole circuit is approximately the opposite of the input/output characteristics of the high-frequency amplifier to be compensated which is serially connected to the non-linearity compensating circuit.

13. A non-linearity compensating circuit for high-frequency amplifiers, comprising a pair of parallel channels each having a high-frequency amplifier of similar characteristics, branching means for branching an input signal to said circuit so that the input signal is coupled to the two inputs of said pair of parallel channels, synthesizing means for taking a vectorial sum of the two output signals from said channels, wherein said branching means and said synthesizing means being parallel-line-couple-type directional couplers, a phase-inverter circuit being added to said pair of parallel channels in order that the effective electric length between input and output of one of the pair of channels differs by about $\pi$ radians from the effective electric length between input and output of the other of the pair of channels, said phase-inverter circuit being a reflection-type phase shifter making use of a circulator which is inserted in at least one of said pair of parallel channels, said high-frequency amplifier included in one of said channels being operable up to the non-linear region of the input/output characteristics, and said high-frequency amplifier included in the other of said channels being operable within the linear region of the input/output characteristics, the operating voltage of said each high-frequency amplifier being variable, whereby the non-linear input/output characteristics of the whole circuit is approximately the opposite of the input/output characteristics of the high-frequency amplifier to be compensated which is serially connected to the non-linearity compensating circuit.

14. A non-linearity compensating circuit for high-frequency amplifiers, comprising a pair of parallel channels each having a high-frequency amplifier of similar characteristics, branching means for branching an input signal to said circuit so that the input signal is coupled to the two inputs of said pair of parallel channels, synthesizing means for taking a vectorial sum of the two output signals from said channels, said high-frequency amplifiers being made of field effect transistors by means of microwave integrated circuit technology, said branching means and said synthesizing means being parallel-line-couple-type directional couplers, a phase-inverter circuit being added to said pair of parallel channels in order that the effective electric length between input and output of one of the pair of channels differs by about $\pi$ radians from the effective electric length between input and output of the other of the pair of channels, said phase-inverter circuit being a reflection-type phase shifter making use of a circulator which is inserted in at least one of said pair of parallel channels, said high-frequency amplifier included in one of said channels being operable up to the non-linear region of the input/output characteristics, and said high-frequency amplifier included in the other of said channels being operable within the linear region of the input/output characteristics, the operating voltage of said each high-frequency amplifier having variable, whereby the non-linear input/output characteristics of the whole circuit is approximately the opposite of the input/output characteristics of the high-frequency amplifier to be compensated which is serially connected to the non-linearity compensating circuit.

* * * * *